United States Patent [19]
Lorteije et al.

[11] 3,993,991
[45] Nov. 23, 1976

[54] DEVICE FOR DRIVING OR ENERGIZING A DISPLAY DEVICE

[75] Inventors: Jean Hubertus Josef Lorteije; Maurice Vincent Whelan, both of Eindhoven, Netherlands

[73] Assignee: U.S. Philips Corporation, New York, N.Y.

[22] Filed: May 16, 1975

[21] Appl. No.: 578,272

[30] Foreign Application Priority Data
May 20, 1974 Netherlands ............... 7406729

[52] U.S. Cl. ............... 340/324 R; 307/304; 324/122; 340/172; 357/23; 357/45
[51] Int. Cl.² ............... G11C 11/40; G01D 7/00
[58] Field of Search ........... 340/324 R, 172; 357/24, 357/45, 23; 307/304, 279, 251; 324/122

[56] References Cited
UNITED STATES PATENTS

| | | |
|---|---|---|
| 3,244,979 | 4/1966 | Hershinger ............... 324/122 X |
| 3,309,610 | 3/1967 | Yamamoto ............... 357/22 X |
| 3,378,688 | 4/1968 | Kabell ............... 357/23 |
| 3,657,573 | 4/1972 | Maute ............... 357/22 |
| 3,667,039 | 5/1972 | Garfein et al. ............... 340/324 R |
| 3,774,195 | 11/1973 | Schulthess et al. ............... 340/324 R |
| 3,775,623 | 11/1973 | Kamiyama et al. ............... 357/23 |
| 3,795,863 | 3/1974 | Umeda et al. ............... 340/324 R |

*Primary Examiner*—David L. Trafton
*Attorney, Agent, or Firm*—Frank R. Trifari; Jack Oisher

[57] ABSTRACT

A device for driving or energizing a display device in which an input signal varying stepwise or continuously in amplitude is converted into one or more output signals supplied to the display device by means of a semiconductor surface layer which can be controlled with a common gate electrode and preferably with an inversion layer which can be controlled in lateral extent.

18 Claims, 9 Drawing Figures

DEVICE FOR DRIVING OR ENERGIZING A DISPLAY DEVICE

The invention relates to a device for converting an electric input signal which varies stepwise or continuously in amplitude into one or more electric signals for driving or energizing one or more display devices.

Display devices are known in which one or more display elements arranged, for example, in a shorter or longer row light up or extinguish in accordance with an electric input signal. Such devices are usually referred to as bar graph displays.

The electric input signal usually has a comparatively low power which is insufficient to energize the display element. In that case an adaptation or transformation should take place.

Furthermore, in the known devices in which the amplitude of the input signal comprises the information and is decisive of the place and/or the configuration of the display element or the display elements which has or have to be driven, a comparatively complicated electronic circuit is necessary to effect the desired conversion of the information.

So in general a converter is necessary which is to be understood to mean within the scope of the invention a device in which a conversion or adaptation of the information content and/or the voltage level and/or the current level is obtained when an electric input signal is applied and an output signal becomes available at at least one output terminal, which signal, if necessary after further amplification, is suitable for driving or energizing a (display element of a) display device.

It is the object of the invention to provide a simple and comparatively cheap converter for use in or in combination with display devices, notably for electric input signals varying stepwise or analogously in amplitude, in which at least the information content given with the amplitude of the input signal is transferred to one or more signals to be used for operating display devices or display elements. As display devices or display elements are to be considered, for example, incandescent lamps, gas discharge tubes, light-emissive diodes and liquid crystals.

According to the invention, a device for converting an electric input signal which varies stepwise or continuously in amplitude into one or more electric signals to be used for driving or energizing one or more display devices is characterized in that in a region of a first conductivity type adjoining a surface of a semiconductor body several surface adjoining surface zones of the second conductivity type opposite to the first conductivity type are present, which surface zones, hereinafter referred to as first surface zones, or each comprise, at least are coupled to, an electric connection for connection to a display device, a common electrode being present to which belongs at least one second surface zone of the second conductivity type present in the region of the first conductivity type, the surface having an insulating layer thereon, a common gate electrode being present to influence a surface layer of the semiconductor body, the common gate electrode having an electric connection for the input signal, the common gate electrode with the associated surface layer which can be influenced providing a connection path of the second conductivity type between the common electrode and the first surface zones of the second conductivity type controllable with the input signal.

The invention provides a device having a simple and hence cheap converter without comparatively complicated electronic circuits which in many cases can immediately control one or more circuits in which display devices are incorporated, while for other uses the signals becoming available at the first surface zones having an electric connection can simply be amplified, if desired, or may be used as control signals for switches incorporated in the circuits with the display devices.

Although the surface region of the first conductivity type may serve as a common gate electrode, as will be explained hereinafter, an insulated common gate electrode is preferably present on the insulating layer and covers the surface layer which can be influenced.

The surface layer which can be influenced may be a doped and, for example, an implanted surface layer the conductivity of which is controlled. Preferably, however, an inversion layer the extent of which can be controlled type is generated in the surface region of the first conductivity with the common gate electrode. Such an inversion layer can be obtained, for example, if the threshold voltage for the occurrence of inversion is suitably place-dependent, for example, in that a quantity of charge which differs from place to place is incorporated in the insulating layer. Said charge may be provided, for example, by means of ion implantation.

The desired place-dependent threshold voltage may also be obtained in another manner known per se, for example, by using an insulating layer of a varying thickness and/or varying dielectric constant between the insulated gate electrode and the semiconductor surface and/or by using for the gate electrode materials having a different work function and/or by providing in the semiconductor body and adjoining the semiconductor surface a doping having a place-dependent concentration.

In all the above-mentioned cases, the inversion layer produced with a voltage at the common gate electrode can be varied as regards its lateral extent by varying said voltage.

An important preferred embodiment of the device according to the invention has an insulated gate electrode which is strip-shaped and which has two electric connections present at a distance from each other and preferably near the two ends of the strip-shaped electrode for applying a potential difference across the gate electrode.

In order to keep the dissipation in the gate electrode occurring as a result of the applied potential difference sufficiently small, the gate electrode preferably consists of resistance material or it comprises at least parts which consist of resistance material. Such a gate electrode or at least part thereof may consist, for example, of a thin metal layer of aluminum, titanium or nickel-chromium. Polycrystalline semiconductor material may also be used as a resistance material. The resistance per square of those parts of the gate electrode across which the potential difference occurs at least mainly is preferably larger than or equal to 1 Ohm. Practical values for said resistance per square are between 10 and approximately 200 OHm in most of the cases and dependent on the desired speed.

The invention will be described in greater detail with reference to a few embodiments and the accompanying drawing, in which FIG. 1 shows diagrammatically a first embodiment of the device according to the invention having a semiconductor body shown in plan view, and FIGS. 2 and 3 are diagrammatic cross-sectional views of the semiconductor body of the device shown in FIG. 1 taken on the lines II—II and III—III, respectively, of FIG. 1.

FIG. 4 is a diagrammatic plan view of a part of a second embodiment, in which

FIG. 6 is a diagrammatic representation of a third embodiment of the device according to the invention, in which

Figure 2:
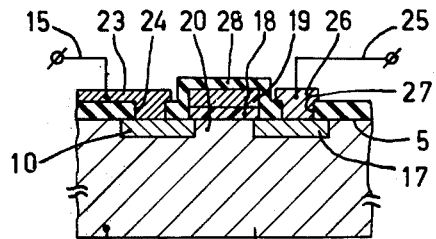
Figure 3:
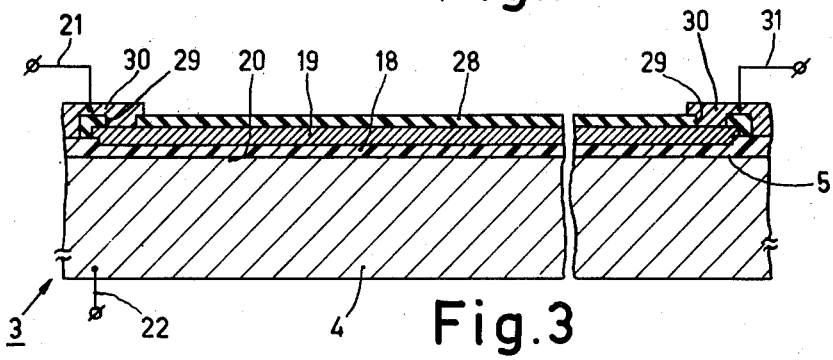

A device for converting an electric input signal originating from the input signal source 1 into one or more electric signals for driving or energizing a display device denoted diagrammatically by the block 2 will now be described as a first embodiment with reference to FIGS. 1, 2 and 3.

According to the invention, the device has a semiconductor body 3 which in the present case is substantially entirely of a first conductivity type. Adjoining a surface 5 of the semiconductor region 4 of the first conductivity type are several surface zones 6, 7, 8, 9 and 10 of the second conductivity type opposite to the first and each having an electric connection 11, 12, 13, 14 and 15, respectively, serving for connection to the display device 2. Said surface zones are hereinafter referred to as first surface zones. Furthermore present is a common electrode 16 to which the second surface zone 17 of the second conductivity type also present in the region 4 belongs. The surface 5 has an insulating layer 18 on which a common gate electrode 19 is provided to influence a surface layer 20 of the semiconductor body 3 present below the gate electrode. The gate electrode 19 has an electric connection 21 and the region 4 of the first conductivity type has an electric connection 22. In the present example the gate electrode 19 bridges the distance between the second zone 17 belonging to the common electrode and each of the first surface zones 6, 7, 8, 9 and 10 and the surface layer 20 which can be influenced adjoins the zone 17 on the one hand and the surface zones 6 through 10 on the other hand. In this manner, as will be explained hereinafter, the gate electrode 19 together with the surface layer 20 which can be influenced provides a controllable electric connection path of the second conductivity type between the common electrode 16 and the first surface zones 6 through 10.

In the present example, the electric connections 11 through 15 are directly connected to the surface zones 6 through 10 via conductor tracks 23 and apertures 24 in the insulating layer 18. The common electrode 16 comprises, besides the second surface zone 17, an electric connection 25 and a conductor track 26 which connects said connection 25 to the second surface zone 17 via an aperture 27 in the insulating layer 18. The gate electrode 19 is strip-shaped and consists of resistance material, for example, a thin layer of NiCr, Ti, Ta or (polycrystalline) semiconductor material. An insulating layer 28 in which apertures 29 are provided near the two ends of the stripshaped gate electrode is present across the gate electrode 19. A conductor track 30 connects the connection 21 at the area of one of the apertures 29 to one end of the strip-shaped gate electrode 19, the other end of said gate electrode 19 being connected to a second electric connection 31 via the other aperture 29 and a conductor track 30.

During operation, a direct voltage source 32 may be connected between the connections 21 and 31, so that a potential drop occurs across the resistance gate electrode 19. With a controllable voltage source 33 between the common electrode 16 and the gate electrode connection 21 (or 31) and/or a controllable voltage source 34 between the common electrode 16 and the connection 22 of the region 4 of the first conductivity type, the device can be adjusted so that, it the input signal is zero, an inversion layer is present below the gate electrode 19 and in the surface layer 20 at the one end connected to the connection 21, of which inversion layer the lateral extent is so small that no conductive connection is formed between the second surface zone 17 and the first surface zone 6. When the amplitude of the input signal increases, the lateral extent of the inversion layer will increase in a direction from the one end to the other end of the gate electrode and the first surface zones 6, 7, 8, 9 and 10 will successively be connected conductively to the surface zone 17 and hence to the common electrode 16.

The display device 2 is, for example a bar graph display and has a number of individual display elements 35 through 39 which are each connected to one of the connections 11 through 15 and to a common supply source 140. Dependent on the value of the amplitude of the input signal, a greater or smaller number of the display elements 35 through 39 will hence be energized.

Figure 1:
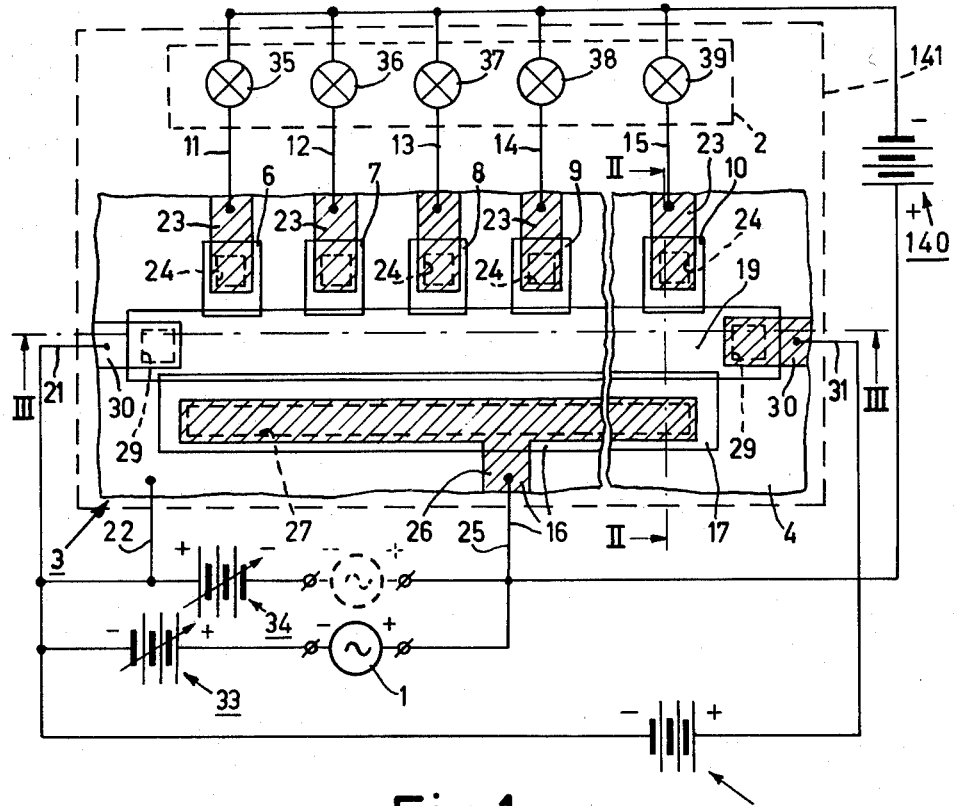

For completenes' sake it is to be noted that with the polarities shown in FIG. 1 of the various voltages, starting point has been the assumption that the region 4 is an n-type semiiconductor region, the surface zones 6 through 10 and the surface zone 17 being p-type. Said conductivity types mmay be interchanged if the polarities of the sources 31, 32, 33 and 34 are also changed.

As is shown in FIG. 1 by broken lines, the input signal source 1 may also be incorporated in the circuit between the connections 22 and 25. In that case the voltage source 34 is adjusted, for example, so that an inversion layer is present below the whole gate electrode 19 when an input signal is absent, while the voltage source 33 is then adjusted so that said inversion layer has just disappeared again. When an input signal is applied, an iversion layer will be formed having an extent which depends on the amplitude of the signal. As regards the control of the extent of the induced inversion layer, the region 4 forms a gate electrode which is equivalent to the insulated gate electrode 19. Both electrodes are separated from the inversion layer to be controlled by an electric barrier, one barrier being constituted by the insulating layer 18 and the other barrier being constituted by a rectitfying junction. Furthermore, instead of a voltage drop across the gate electrode 19, a voltage drop across the semiconductor region 4 is also acceptable.

The display device may be constructed, for example, with incandescent lamps, gas discharge tubes, one or more liquid crystals or light-emissive diodes, it being simply possible to adapt the circuit with the supply source 140 to the display device chosen. If light-emissive diodes are used, they may or may not be integrated in the semiconductor body 3. Preferably the semiconductor device which converts the input signal into one or more electric output signals and the display device or display devices at least are combined to form a structural unit, which is shown diagrammatically in FIG. 1 by the broken-line-block 141.

By means of the voltage source 33 and/or the voltage source 34, the device may be adjusted so that with input signal zero or with the most negative, stiill observable value of the input signal, the first display element 35 is just energized or is just not yet energized. By means of the voltage source 32, such an adjustment can be obtained that with the most positive value of the input signal all the display elements up to and including the last element 39 are energized. the number of display elements can simply be adapted to the use and the resolving power required therefor. It is shown in FIG. 1 by means of a fracture line extending between the surface regions 9 and 10 that the number of surface regions having a connection may be chosen to be comparatively arbitrary.

The semiconductor device described can be manufactured entirely by means of methods conventionally used in semiconductor technology. the semiconductor 4, for example, is an n-type silicon substrate having a resistivity of, for example, 2 to 5 ohm cm. By diffusion or ion implantation, p-type surface zones 6 through 10 and 17 can be provided therein and extend, for example, down to a depth of 1 to 2 $\mu$m from the surface 5 in the semiconductor body. The surface concentration of said zones, is, for example, between $10^{18}$ and $10^{21}$ atoms/ccm. The p-type zones 6 through 10, for example, have dimensions of approximately 20 × 25$\mu$m. The zone 17 has a width of, for example, 25$\mu$m, the length depending on the number of display devices to be controlled and the desired mutual distance between the zones 6 through 10. In a device for controlling nine display elements, the mutual distance between the zones 6 through 10 was approximately 100$\mu$m and the zone 17 had a length of approximately 1 mm. The distance between the zones 6 through 10 and the zone 17 is, for example, approximately 8$\mu$m. It is to be noted that instead of a single elongate second zone 17, a number of smaller second zones 17 arranged in a row may also be used, which zones are each present opposite to one of the first zones 6 through 10 and are connected together, for example, with a conductive track. A single smaller second zone 17 will also suffice, although in that case the series resistance occurring in the inversion layer between such a smaller second zone 17 and each of the first zones 6 through 10 is different for each of the last-mentioned zones. The zone 17 preferably serves at least as a source of charge carriers which are necessary for the formation of the inversion layer.

The semiconductor surface may be provided in the usual manner with an insulating layer of, for example, silicon oxide and/or silicon nitride, said layer at the area of the gate electrode 19 preferably having a smaller thickness (for example, zpproximately 0.1$\mu$m) than outside said region where the thickness is, for example, approximately 1 to 1.5$\mu$m.

The gate electrode 19 has a width of, for exammple, approximately 10$\mu$m and a length of approximately 1 mm and consists, for example, of aluminum, titanium, tantalum or polycrystalline silicon. The resistance per square of the layer used for said gate electrode is preferably between 10 and approximately 200 Ohm and is at least 1 Ohm. According as the resistance per square is higher, the dissipation in the resistance electrode, but also the speed of the device, will decrease.

The gate electrode need not be but may be covered with an insulating layer 28 which, in accordance with the material used for the gate electrode, may be obtained by thermal or anodic oxidation. An insulating layer may also be deposited from the vapor phase or be provided by sputtering.

Figure 4:
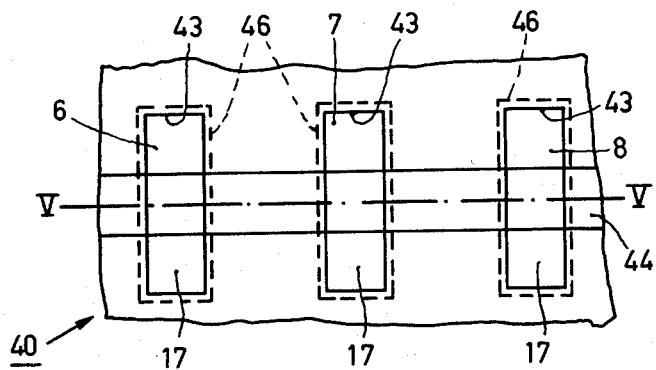
Figure 5:
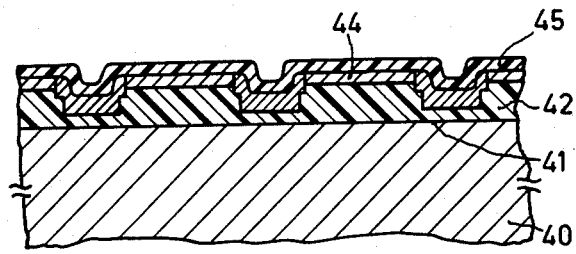
FIG. 5 is a diagrammatic associated cross-sectional view taken on the line V—V of FIG. 4.

For example, when polycrystalline silicon is used as a material for the gate electrode, the gate electrode may also be self-registering. In that case, for example, first an insulating layer 42 of silicon oxide which has a comparatively large thickness and in which a number of, for example, rectangular regions 43 of a smaller thickness are provided, is provided on the semiconductor surface 41 of an n-type semiconductor body 40 (FIGS. 4 and 5). As strip 44 of comparatively high-ohmic p-type polycrystalline silicon is then provided, which strip has a masking layer 45 of silicon oxide. With the aid of a mask in which a few apertures 46 approximately of the size of the regions 43 are provided, which apertures are shown in broken lines in FIG. 4, the uncovered thin parts of the insulating layer 42 and the uncovered parts of the insulating layer 45 are removed. Impurities are then diffused or implanted, a number of p-type (second) surface zones 17 being formed on one side of the strip 44 and a number of p-type (first) surface zones 6 through 10 being formed on the oppositely located side. simultaneously the parts of the gate electrode 44 present between surface zones present opposite to each other are also doped. The first zones 6 through 10 may each have an electric connection and the second zones 17 may be connected together and to a common electrode by means of a conductive track.

The gate electrode 44 consists of a number of compartively high-ohmic parts present between adjacent first zones 6 through 10 and alternated by comparatively low-ohmic parts situated between first and second p-type zones present opposite to each other. A potential difference applied across the gate electrode will now be substantially across the high-ohmic parts of the gate electrode, while across the low-ohmic parts substantially no potential difference will occur. The advantage of this is that the connection paths between each of the first zones 6 thorugh 10 and the oppositely located second zone 17 will change less gradually and be better defined from the non-conductive into the conductive state, and conversely. Moreover, when the potential difference across the gate electrode remains the same, the potential gradient in the high-ohmic parts of such a gate electrode will be larger than in a homogeneous resistance gate electrode. By restricting the occurrence of a potential gradient in the resistance electrode as much as possible to the high-ohmic parts of the resistance electrode present between adjacent first zones 6 through 10, a relatively favorable ratio between the resolving power and the dissipation occurring in the resistance electrode is obtained. Preferably, the potential difference occurring across a part of the common gate electrode present between two adjacent first zones is at least 0.2 to 0.3 volt.

For reasons of clairty it is to be noted that due to the difference in thickness in the insulating layer 42 when the input signal increases a number of inversion layers which are separated from each other and which each connect a second zone 17 to one of the first zones 6 through 10 are formed in this case rather than and instead of a growing continuous inversion layer as in the previous example.

The part of each of the connection paths formed as an inversion layer between the common electrode and each of the first zones 6 through 10 has a certain width, and it may be of importance, in connection with a readily defined commutation, that said parts of the connection paths are formed or disappear substantially simultaneously throughout their width. For that purpose, the potential difference occurring across each of the parts of the gate electrode present above said connection paths is preferably restricted. For this reason the gate electrode preferably consists of a number of low-ohmic parts which are present above the connection paths to be controlled and which are connected together with comparatively high-ohmic parts. The low-ohmic parts comprise, for example, comparatively heavily doped semiconductor material or metal and the high-ohmic parts comprise resistance material, for example, comparatively low-doped semiconductor material, titanium, tantalum or nickel-chromium. The low-ohmic parts can also be obtained by bridging the desired parts of a gate electrode formed entirely from resistance material with a conductive layer.

Another attractive possibility which is in favor of the defined commutation is to situate the parts of the connection paths formed as an inversion layer parallel to the insulated gate electrode instead of transversely to said gate electrode. This possibility is used in the following embodiment which will be described with reference to FIGS. 6 and 7.

Figure 6:
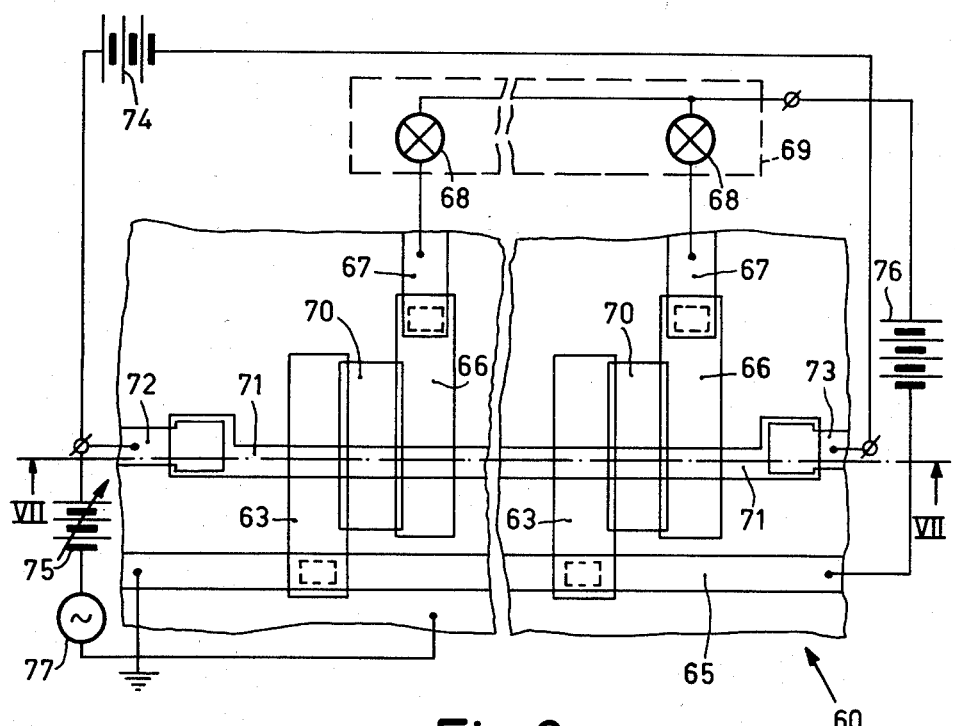
Figure 7:
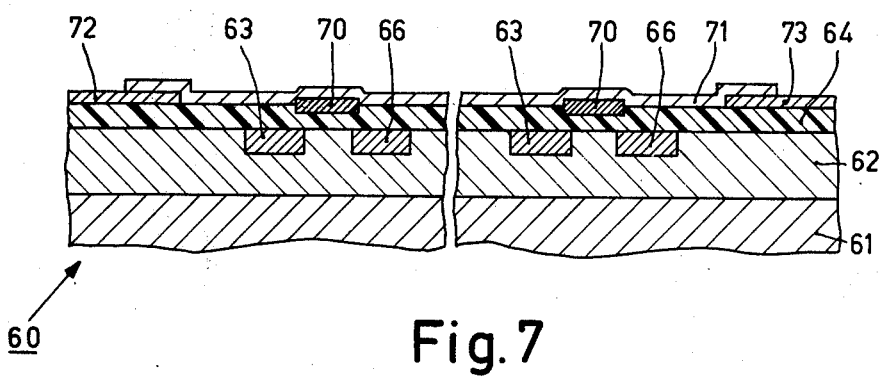
FIG. 7 is a diagrammatic cross-sectional view of the semiconductor body of said third embodiment taken on the line VII—VII of FIG. 6.

FIGS. 6 and 7 show a part of a semiconductor body 60 which comprises an n-type semiconductor substrate 1 of, for example, silicon and a p-type surface region 62 which may be formed, for example, by an isolated island of an integrated circuit. The remaining part of said integrated circuit which is of minor importance within the scope of the invention and will therefore not be described in detail may comprise, for example, an analog amplifier which amplifies a comparatively small input signal to such an extent that the converter can subsequently be controlled with it. The output of the converter may also be connected, for example, to amplifiers in the form of flipflops so as to increase the current and/or voltage available for the display elements.

The surface region 62 comprises a number of n-type second surface zones 63 which belong to a common electrode and are connected together via a conductive track 65 present on the insulating layer 64. An n-type first surface zone 66 is provided beside each of the second zones 63, each first zone 66 being connected to a conductive track 67. The conductive tracks 67 constitute the outputs of the converter which may be connected to display elements 68 of a display device 69.

The first and second surface zones 63 and 66 are arranged pairwise, the insulating layer 64 between each of the said pairs having a thinner part which is covered with a conductive layer 70 isolated from the semiconductor body. In a direction transverse to the surface zones 63 and 66 and parallel to the controllable electric connection paths present between the pairs of surface zones, a strip 71 of resistance material is provided which is electrically connected to each of the conductive layers 70. This strip 71 and the conductive layers 70 together constitute an isolated gate electrode for controlling connection paths between the common electrode 63, 65 and each of the first zones 66. Said isolated gate electrode which may also be manufactured entirely from resistive material has an electric connection in the form of conductive layers 72 and 73, respectively, at either end.

The isolated gate electrode has an elongate base 71 across which the potential drop occurs mainly and, in a direction transverse to said base, on one or both sides projections or fingers 70 which are present above the parts of the semiconductor surface layer in which the connection paths or channels are formed. In this configuration, the ratio between the length and the width of the channels can be adapted to the desired current level within wide limits.

During operation, a potential difference is applied across the isolated gate electrode by means of a voltage source 74. The common electrode 63, 65 is connected to a point of reference potential, for example earth, as well as the surface region 62. Between said electrode 63, 65 and one of the connections of the gate electrode, another voltage source 75 to adjust the converter may be connected. The display device 69 is furthermore connected to a supply source 76. The input signal source 77 may be arranged, for example, in series with the voltage source 75.

The embodiments described have in common that an insulated gate electrode is used which consists at least partly of resistive material. Such a resistive gate electrode is an elegant aid to obtain an inversion layer which expands along a larger or smaller part of the semiconductor surface in accordance with the amplitude of the input signal. The inversion layer which is continuous or consists of several separate parts constitutes a kind of slide contact which connects a larger or smaller number of a row of first surface zones to the common electrode. Said row of first surface zones may be located substantially on a straight line as in the examples or be arranged according to a quite different form, for example, (a part of) the circumference of a circle. The device may be used as a make contact as in the examples, but it may also be used as a break contact in which, in the absence of an input signal, all outputs are energized and, when the input signal increases, more and more connections are interrupted.

Besides with a potential difference across a resistive electrode, a suitably controllable surface layer can also be obtained differently. For example, the threshold voltage which is necessary for the formation of a conductive connection may be made different from place to place. The gate electrode 19 of the first example may be replaced, for example, by a conductive layer, the thickness of the insulating layer 18 increasing gradually or stepwise from the connection 21 in the direction towards the end with the connection 31. Another possibility of obtaining a place-dependent threshold voltage is the incorporation of charge in the insulating layer, for example, by means of ion implantation. When the layer 18 consists of a double layer of silicon oxide and silicon nitride, the memory effect known per se for said double layers may be used. Charge with a concentration increasing or decreasing in the direction of the gate electrode can be recorded in the double layer by means of a suitable voltage at the gate electrode 19 which is conductive in this case also and a potential difference in the semiconductor substrate 4 extending parallel to said electrode.

An inversion layer is induced in the embodiments described. It will be obvious, however, that converters may also be used in which a surface layer of the same conductivity type as the first and second surface zones is provided below the gate electrode in a different manner, for example, by doping. By means of a voltage at the gate electrode and/or the underlying semiconductor region of the opposite conductivity type, the conductibility of such a surface layer can be controlled in a similar manner so that the desired connections are obtained.

In the embodiments described so far, usually several outputs are simultaneously energized, dependent on the input signal. For certain uses it may be desired, however, that always, for example, at most one or two outputs are energized simultaneously. This can simply be realised by the addition of a second similar converter, for example as is shown in FIG. 8.

The semiconductor body 80 has a common electrode formed by second surface zones 81 of one conductivity type provided in a surface region 82 of the opposite conductivity type and a conductive track 83 which connects the second zones 81 together. Furthermore, the surface region 82 comprises a number of first surface zones 84 of one conductivity type which are each connected to their own conductive track 85 for the connection to the display device not shown. The zones 84 and the tracks 85 constitute, at least belong to, the outputs of the converter which are denoted diagrammatically by terminals 86. Present in the surface region 82 are also surface zones 87 of one conductivity type which each belong both to a zone 81 and to a zone 84. By means of a first resistive gate electrode 88, connections between zones 81 and 87 can be controlled, while with a second resistive gate electrode 89 the zones 87 can be controllably connected to the zones 84. So the converter consists of two parts which are each individually substantially equal to the converter shown in FIGS. 6 and 7 and in which the outputs of the first part also constitute inputs for the second part. The common or connection zones 87 will be superfluous in a configuration in which the surface layers in the semiconductor body which are controllable with the gate electrodes 88 and 89 directly join each other.

The converter described may be operated as follows. The common electrode 81, 83 is connected to a reference potential, for example, to earth and to the surface region 82. In the last-mentioned circuit a controllable voltage source 90 for adjusting the device may be incorporated, if desired. With the aid of voltage sources 91 and 92, a potential difference is applied across each of the resistive gate electrodes in such manner that the potential drop in one gate electrode occurs in one direction and in the other gate electrode occurs in the opposite direction. In FIG. 8, the left-hand end of the gate electrode 88 is the most negative and the right-hand end is the most positive. On the contrary, the left-hand end of the gate electrode 89 is the most positive and the right-hand end is the most negative. The potential differences applied across the two electrodes 88 and 89 are of equal value and are, for example, approximately 12 volts.

Figure 8:
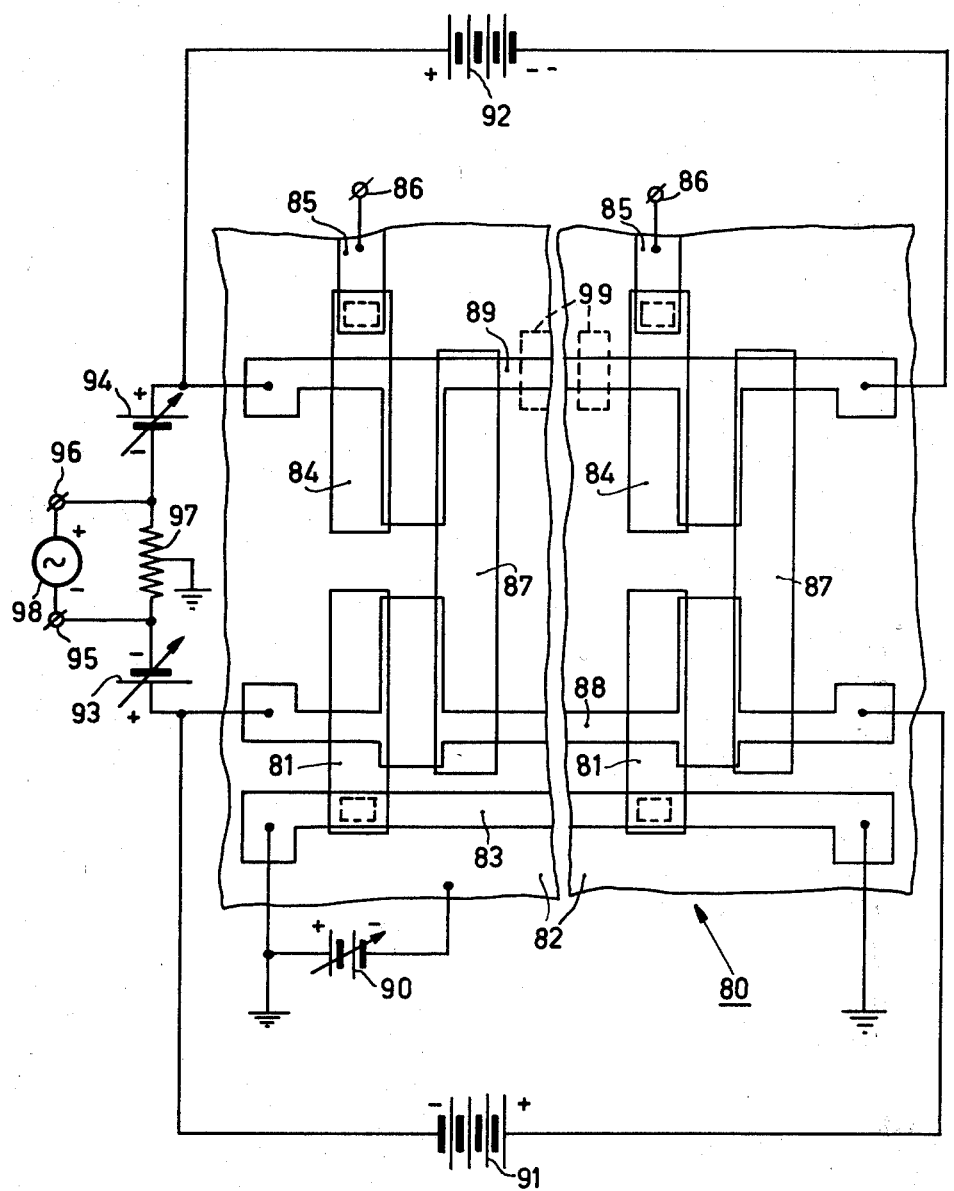
FIG. 8 is a diagrammatic plan view of a part of a further embodiment of the device according to the invention.

It is shown on the left-hand side of FIG. 8 that the gate electrodes 88 and 89 are each connected to input terminals 95 and 96, respectively, via voltage sources 93 and 94, respectively. Present between the input terminals 95 and 96 is a resistor 97 having a center tap which is connected to earth. Said terminals are further connected to an input signal source 98 so that the signals applied to the electrodes 88 and 89 are equal to each other, but with a phase difference of 180°.

The voltage sources 91 and 92 each provide a voltage which is at least equal to the difference between the largest and the smallest voltage value of the input signal. By means of the voltage sources 90, 93 and 94, the converter is adjusted so that with the smallest or most negative input signal voltage the voltage at the two gate electrodes 88 and 89 at the level of the first, extreme left pair of surface zones 81, 87 and 84, 87, respectively, is such that an inversion layer is present between the zones of each of the said pairs. Starting from a semiconductor structure having a p-type region 82 and n-type surface zones 81, 84 and 87, it will hold with the given polarities for the gate electrode 88 that all the pairs of surface zones 81, 87 present more towards the right are connected together by inversion layers. The potential distribution across the gate electrode 89 on the contrary is such that an inversion layer is present only between the zones 84, 87 of the extreme left pair. Only the extreme left terminal 86 is hence conductively connected to the common electrode 81, 83. According as the input signal becomes more positive, the connections between the zones 81 and 87 formed in the lowermost part by inversion layers will be interrupted successively from the extreme left pair proceeding towards the right, while simultaneously in the uppermost part proceeding from left to right connections will be formed successively in increasing numbers of pairs of zones 84 and 87 by the formation of inversion layers. In this manner, always only one of output terminals 86 is energized. Such a device may be used, for example, for driving digit tubes or for addressing rows or columns in matrices as they occur in display panels or in memories.

It is of importance for the satisfactory operation of the above-described device that at least below the gate electrode 89 no continuous inversion layer can be formed because otherwise the terminals 86 are no longer isolated from each other. This can be achieved by using an insulating layer which is comparatively thick with the exception of those places where inversion layers are to be formed. If necessary, channel stoppers, for example, in the form of semiconductor zones 99 of the same conductivity type as but having a higher doping concentration than the surface region 82 may be provided between the successive pairs of surface zones 84, 87 below the gate electrode 89. For this purpose, in the entire semiconductor surface-adjoining layer of the surface region 82 with the exception of at least those parts where an inversion layer is to be formed, a higher doping concentration may also be used than in the adjoining part of said region 82 present therebelow.

For completeness' sake it is to be noted that by the adjustment of the extent to which the two inversion layers produced with the resistive electrodes overlap each other, the number of adjacent terminals 86 which is simultaneously energized can be controlled at will.

Figure 9:
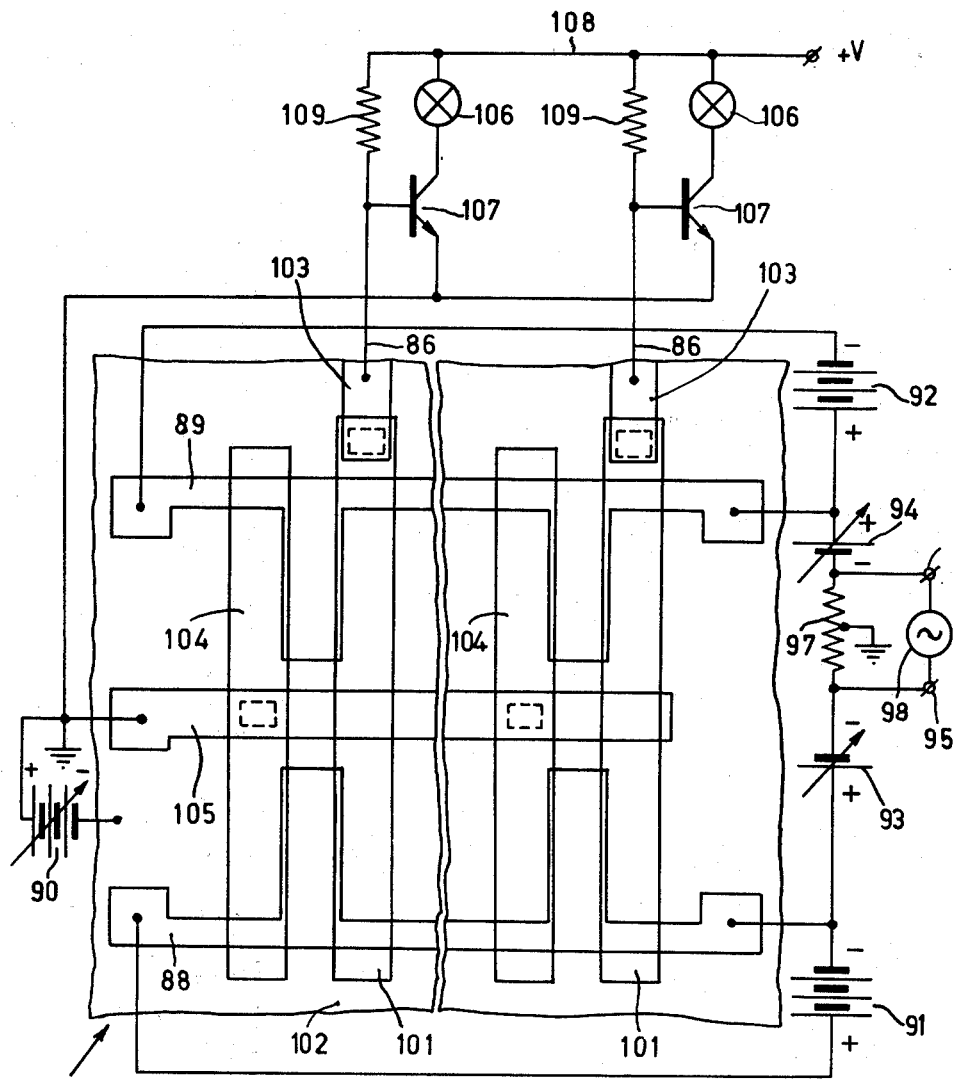
FIG. 9 is a diagrammatic plan view of a part of still another embodiment of the device according to the invention.

Another embodiment in which two resistive electrodes are also used is shown in FIG. 9. The semiconductor body 100 has a number of first surface zones 101 of a conductivity type opposite to that of the surface region 102 adjoining same. The n-type first surface zones 101 each have an electric connection which is formed by the conductive tracks 103 which are connected directly to said zones. The zones 101 are elongate and are present each beside an associated n-type surface zone 104 of the same conductivity type. The zones 104 constitute the second surface zones of the device and are connected together by the conductive track 105 which extends transversely to the elongate zones 101 and 104 at the level of the center of said zones. A comb-shaped resistive electrode of a similar shape and construction to the electrodes 88 and 89 of FIG. 8 is present on the two oppositely located sides of the conductive track 105. Therefore they are referred to by the same reference numberals in FIG. 9. The device shown in FIG. 9 otherwise also considerably resembles that shown in FIG. 8, in which the last-mentioned may be considered to be constructed from two parts which are connected in series, while said two parts in the device shown in FIG. 9 are connected in parallel. The device shown in FIG. 9 is operated entirely as that shown in FIG. 8 with voltage sources 90, 91, 92, 93 and 94 for adjusting the controllable inversion layers and input signals of equal value and opposite phase which are applied to the gate electrodes 88 and 89. In this case, however, the voltage sources 90, 93 and 94 are adjusted so that the two inversion layers show no overlap in such manner that always at most the desired number of adjacent connections 103, 86 is not connected to the common electrode 104, 105, while the zones 103 present on the left-hand thereof as viewed in FIG. 9 are connected, via an inversion layer present below the lowermost electrode 88, to a zone 104, so to earth, and all zones 103 present more towards the right are connected to earth via an inversion layer present below the uppermost electrode 89.

The connections 86 are connected to a display device having a number of display elements 106 which are each connected in series with the main current path of a transistor 107 between a supply line 108 and, for example, earth. The control electrodes of the transistors 107 are connected to the supply line 108 via a resistor 109. Said resistors serve to supply the required control current if the transistors 107 are conductive and the display elements 106 are energized. Via the connections 86, said control currents are dissipated to earth with the exception of that connection or those connections 86 which is or are not connected via an inversion layer to a zone 104 and the common electrode 105. Only the transistor(s) connected to the last-mentioned connection(s) 86 is or are then conductive so that only the display elements connected thereto light up. The remaining display elements are extinguished.

The device according to the invention may be adapted to specific requirements of different uses by adapting the geometries and the doping concentrations. In the embodiment shown in FIGS. 1, 2 and 3 a suitable voltage value for the source 32 is, for example, approximately 10 volts. The overall resistance value of the gate electrode 19 may vary from one or a few kOhms to 50 kOhms or more dependent on the length and the dissipation deemed admissible as well as the speed desired for the device. The voltage source 34 is usually superfluous. The connections 22 and 25 are then connected together directly. For that purpose, for example, the pn junction between the surface zone 17 and the surface region 4 may be shortcircuited at the semiconductor surface 5. A value of 1 to 2 volts for the adjusting voltage source 33 is usually sufficient. The voltage value of the supply source 140 has an upper limit due to the breakdown voltage of the p-n junction between the zones 6 through 10 and the surface region 4 and is further dependent on the type of display elements used. For gas discharge tubes, for example, comparatively little current and often a comparatively high voltage of 60 to 80 volts is necessary, whereas light-emissive diodes usually require more current and a lower voltage of one or a few volts. The voltage required for liquid crystals is usually in the order of 20 volts.

It will be obvious that the invention is not restricted to the embodiments described but that many variations are possible to those skilled in the art without departing from the scope of this invention. For example, other semiconductor materials such as germanium or $A_{III}B_V$-components may be used. When the input signal is supplied to the surface region and the threshold voltage is place-dependent due to incorporated charge in the insulating layer and/or due to that the doping concentration at the surface of the semiconductor region is locally different, no insulated gate electrode need be present on the insulating layer. The resistive electrode described may also be replaced by a semiconductor resistor, for example, a diffused resistor, in combination with a number of conductive gate electrodes connected to different taps of said resistor. Furthermore, in the embodiments the same distances are used between the surface zones connected to the various outputs, so that the number of energized outputs increases directly proportionally to the amplitude of the input signal. By adapting the resistance values between the parts of the resistive electrode present between the successive connection paths to be formed by inversion, for example, by adapting the mutual distance of the first zones and/or local adaptation of the resistance per square of the resistive electrode, relations to the input signal other than linear relations may be realised. For this same purpose, the geometry of the resistive electrode, for example, the width of the resistance layer 71 of the example shown in FIGS. 6 and 7, may also be adapted locally.

If desired, switches to control the instant of reading the information may be incorporated between the first surface zones and the connections thereof, for example between the zones 84 and the terminals 86 of the embodiment shown in FIG. 8. Said switches may be constructed, for example, as insulated gate field effect transistors, in which the gate electrodes of said switches may be connected together. By means of said switches the outputs, for example, may be blocked if the input signal changes from a given value to another value, display being carried out only when sufficient time has elapsed so as to be sure that the information available at the outputs corresponds to the changed input signal.

The connections between the first surface zones and their electric connections need not always be direct, ohmic connections. For example, circuit element may be incorporated in said connections in such manner that each first surface zone is nevertheless coupled electrically to its own connection.

What is claimed is:
1. A semiconductor device for converting an amplitude-varying electrical input signal into electrical outputs whose number or selection depends upon the amplitude of the input signal, comprising a semiconductive body having a surface region of a first type conductivity, plural spaced first surface zones of a second type conductivity located in said first type region, second surface zone portions of the second type conductivity also located in said first type region and spaced from said first surface zones, an insulating layer over the body surface, a common gate electrode located adjacent the spaces between the first zones and the second zone portions, separate connections coupled to the first zones via which separate signal outputs can be obtained to operate an additional device, a common connection to the second zone portions, means for coupling an input electrical signal between the connection to the second zone portions and the gate electrode, and means including applying potentials to the electrodes and connections for breaking or making connections between the second zone portions and selected ones of the first zones in accordance with the amplitude of the signal input by terminating or establishing, respectively, in the semiconductive body conductive paths therebetween.

2. A device as claimed in claim 1 wherein the common gate electrode comprises an insulated electrode extending over the insulating layer and located over the spaces between the first zones and the second zone portions.

3. A device as claimed in claim 2 wherein the insulated gate electrode comprises two spaced electric connections with a strip-shaped part between, and means for applying across the two gate connections a potential difference which thus extends across the strip-shaped part of the gate electrode.

4. A device as claimed in claim 3 wherein the strip-shaped part of the gate electrode comprises resistance material.

5. A device as claimed in claim 4 wherein the insulated gate electrode is comb-shaped and has a strip-shaped base portion which, at least on one of its long sides, has several projecting fingers, at least the parts of the base portion present between adjacent fingers comprising resistance material.

6. A device as claimed in claim 4 wherein the part of the gate electrode comprising resistance material is in the form of a layer whose resistance per square is at least 1 Ohm.

7. A device as claimed in claim 6 wherein the resistance per square is at least 10 Ohm and not larger than approximately 200 Ohm.

8. A device as claimed in claim 1 wherein the conductive paths are constituted by a second type surface inversion layer having an extent, in a direction substantially parallel to the surface, in accordance with the amplitude of the signal input and being located in the first type surface region adjacent and controllable by the gate electrode.

9. A device as claimed in claim 8 wherein the first surface zones and the second zone portions are located such that inversion layers established between the first zones and second zone portions are separated from each other, which together constitute the inversion layer having a controllable extent.

10. A device as claimed in claim 1 wherein the second zone portions are united to form a single zone.

11. A device as claimed in claim 1 wherein the second zone portions are separated from each other and from at least one of the first surface zones by first type material.

12. A device as claimed in claim 5 wherein the first surface zones and the second surface zone portions are arranged in pairs, the part of the first type region present between the first surface zones and the second surface zone portions of each pair extending substantially entirely below a finger of the insulated gate electrode.

13. A device as claimed in claim 2 wherein additional first surface zones and additional second surface zones portions of the second type conductivity are present in the first type region, and a second common insulated gate electrodes is provided located over the spaces between the additional first zones and the additional second zone portions.

14. A device as claimed in claim 13 and further comprising means connecting each of the first zones associated with the first insulated gate electrode to one of the first zones associated with the second gate electrode.

15. A device as claimed in claim 13 and further comprising means connecting each of the first zones associated with the first insulated gate electrode to a separate second zone portion associated with the second gate electrode.

16. A device as claimed in claim 13 wherein the input electrical signal is applied in phase opposition to each of the insulated gate electrodes.

17. A semiconductor device as claimed in claim 1 in combination with a display device having multiple inputs and adapted to produce a display in accordance with the number or selection of inputs energized, and means for coupling each of the first zone connections to one of the display device inputs.

18. A semiconductor device for converting an amplitude-varying electrical input signal into electrical outputs whose number or selection depends upon the amplitude of the input signal, comprising a semiconductive body having a surface region of a first type conductivity, plural spaced first surface zones of a second type conductivity located in said first type region, second surface zone portions of the second type conductivity located in said first type region and spaced from said first surface zones, an insulating layer over the body surface, a common gate electrode located adjacent the spaces between the first zones and the second zone portions, separate connections coupled to the first zones via which separate signal outputs can be obtained to operate an additional device, a commonn connection to the second zone portions, means for coupling an input electrical signal between the connection to the second zone portions and the gate electrode, and means for establishing at the first type region portions located between each of the first zones and the second zone portions different threshold voltages determining generation or extinction of an inversion layer therebetween for selectively breaking or making connections between the second zone portions and selected ones of the first zones in accordance with the amplitude of the signal input.

* * * * *